US009093155B2

(12) United States Patent
Sakurai

(10) Patent No.: US 9,093,155 B2
(45) Date of Patent: Jul. 28, 2015

(54) SEMICONDUCTOR MEMORY DEVICE

(71) Applicant: Kabushiki Kaisha Toshiba, Tokyo (JP)

(72) Inventor: Katsuaki Sakurai, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 164 days.

(21) Appl. No.: 13/784,625

(22) Filed: Mar. 4, 2013

(65) Prior Publication Data

US 2014/0063962 A1     Mar. 6, 2014

(30) Foreign Application Priority Data

Aug. 29, 2012  (JP) .................................. 2012-188530

(51) Int. Cl.
| | | |
|---|---|---|
| G11C 7/02 | (2006.01) | |
| G11C 16/08 | (2006.01) | |
| G11C 16/26 | (2006.01) | |
| G11C 16/34 | (2006.01) | |
| H01L 27/115 | (2006.01) | |
| G11C 11/4074 | (2006.01) | |
| G11C 16/10 | (2006.01) | |

(52) U.S. Cl.
CPC ................ *G11C 16/08* (2013.01); *G11C 16/26* (2013.01); *G11C 16/3427* (2013.01); *H01L 27/1157* (2013.01); *H01L 27/11582* (2013.01); *G11C 11/4074* (2013.01); *G11C 16/10* (2013.01)

(58) Field of Classification Search
CPC ...... G11C 11/4074; G11C 16/30; G11C 7/06; G11C 16/10; G11C 16/12
USPC ........... 365/189.09, 189.11, 189.08, 204, 206
See application file for complete search history.

(56) References Cited

U.S. PATENT DOCUMENTS

| | | | | |
|---|---|---|---|---|
| 4,984,202 | A * | 1/1991 | Kawahara et al. | 365/177 |
| 6,088,286 | A * | 7/2000 | Yamauchi et al. | 365/230.06 |
| 7,023,262 | B2 * | 4/2006 | Sim et al. | 327/541 |
| 7,542,363 | B2 * | 6/2009 | Kubo et al. | 365/207 |
| 7,898,851 | B2 * | 3/2011 | Maejima et al. | 365/185.03 |
| 8,780,636 | B2 * | 7/2014 | Maejima | 365/185.18 |
| 2009/0159949 | A1 | 6/2009 | Maejima et al. | |
| 2011/0284946 | A1 | 11/2011 | Kiyotoshi | |

FOREIGN PATENT DOCUMENTS

| | | |
|---|---|---|
| JP | 2000-100183 | 4/2000 |
| JP | 2009151873 A | 7/2009 |

* cited by examiner

*Primary Examiner* — Viet Q Nguyen
(74) *Attorney, Agent, or Firm* — Patterson & Sheridan, LLP

(57) ABSTRACT

A semiconductor memory device includes a memory cell array in which memory cells are arranged, and a first wiring connected to the memory cells. A discharging circuit discharges the voltage of the first wiring according to a first current. In addition, a charging circuit charges the voltage of the first wiring according to a second current. A control circuit detects the voltage of the first wiring and controls a magnitude of the second current based on the detected voltage. A current detection unit generates a third current proportional to the second current and generates a detection result based on a magnitude of the third current. The discharging circuit is configured to control a magnitude of the first current in accordance with the detection result.

5 Claims, 10 Drawing Sheets

SEMICONDUCTOR MEMORY DEVICE

CROSS-REFERENCE TO RELATED APPLICATION

This application is based upon and claims the benefit of priority from Japanese Patent Application No. 2012-188530, filed Aug. 29, 2012; the entire contents of which are incorporated herein by reference.

FIELD

Embodiments described herein relate to a semiconductor memory device.

BACKGROUND

A NAND-type flash memory is a well-known semiconductor memory device that can store data in a nonvolatile fashion with high storage capacity. A cell array of NAND-type flash memory is formed by arranging NAND cell units in which several memory cells are connected in series. Word and bit lines are used to read and write data to specific memory cells. Word lines connect memory cells in different cell units and bit lines each connect to a different cell unit.

A potential problem with NAND-type flash memory is that a parasitic capacitance between adjacent or near-by word lines increases as device feature sizes decrease as a result of device miniaturization. As more memory cells and, therefore, word lines are included in smaller spaces there are increasing problems with parasitic capacitance between word lines, which may adversely affect device performance.

Due to parasitic capacitance, when a desired (predetermined) voltage for reading or writing data is supplied to selected word lines, a voltage overshoot is sometimes caused in the selected word lines by capacitive coupling with adjacent word lines. If the overshoot is large, device response time is delayed until the desired voltage is actually obtained. Delayed response times can cause poor device performance. This capacitive coupling phenomenon is especially distinct in three-dimensional NAND-type flash memory arrays.

DETAILED DESCRIPTION

Figure 1:
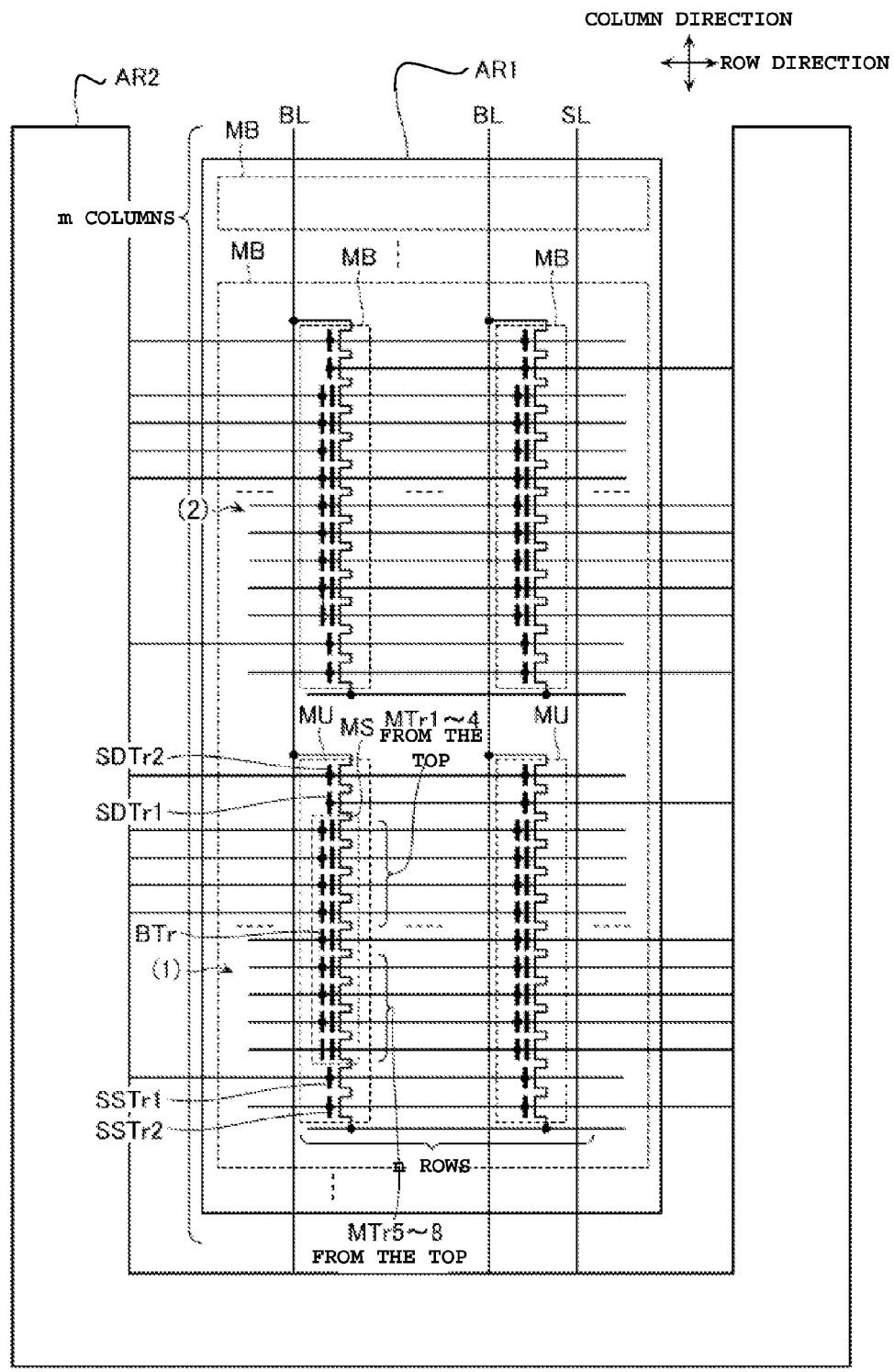
FIG. 1 is a circuit diagram showing a nonvolatile semiconductor memory device according to a first embodiment.

In the semiconductor memory device of the present disclosure, the performance of the device can be improved by reducing response time delays due to voltage overshoots. In general, the nonvolatile semiconductor memory device of the present disclosure will be explained by reference to example embodiments depicted in the drawings.

A semiconductor memory device includes a memory cell array in which memory cells are arranged, and a first wiring which is connected to the memory cells. A discharging circuit discharges the voltage of the first wiring according to a first current. In addition, a charging circuit charges the voltage of the first wiring according to a second current. A control circuit detects the voltage of the first wiring and controls the charging of the first wiring. A current detection unit generates a third current proportional to the second current and generates a detection result in accordance with the size of the third current. The discharging circuit is configured to control the size of the first current in accordance with the detection result from the current detection unit.

(First Embodiment)

First, the nonvolatile semiconductor memory device of the first embodiment will be explained with reference to FIG. 1. FIG. 1 is a circuit diagram depicting the nonvolatile semiconductor memory device according to the first embodiment.

As shown in FIG. 1, the nonvolatile semiconductor memory device of the first embodiment has a memory array AR1 and a control circuit AR2 installed at the periphery of memory array AR1.

The memory cell array AR1 is constituted by several memory strings MS in which electrically rewritable memory transistors MTr1-8 (memory cells 1 through 8) are connected in series. The control circuit AR2 comprises various kinds of control circuits for controlling voltages applied to the gates of the memory transistors MTr (MTr1-8).

The control circuit AR2 implements an operation for writing data to the memory transistors MTr, an erasing operation for erasing data in the memory transistors MTr, and an operation for reading data from the memory transistors MTr. At a time of the write operation and the readout operation, a voltage is applied to selected memory strings MS. This voltage is approximately that used in a conventional stacked flash memory device.

The memory cell array AR1 has m columns of memory blocks MB. Each memory block MB has n rows and two columns of memory units MU. The memory unit MU includes a memory string MS, first source side select transistor SSTr1 connected in series to the source end of the memory string MS, second source side select transistor SSTr2, first drain side select transistor SDTr1 connected in series to the drain end of the memory string MS, and second drain side select transistor SDTr2. As an example, there are two each of the drain side select transistors and source side select transistors in one memory string MS; however, this is only an example, and one each of the drain side select transistor and the source side select transistor may be used. Here, in the example shown in FIG. 1, the first column of the memory units MU is labeled (1), and the second column is labeled (2). In each memory block MB, two memory units MU arranged in the column direction share the bit line BL. In each memory block MB, n pieces of memory units MU parallel with the row direction share word lines, select gate lines, source lines, and back gate lines. Bit lines BL and source lines SL are shared by the m columns of memory blocks MB.

Figure 2:
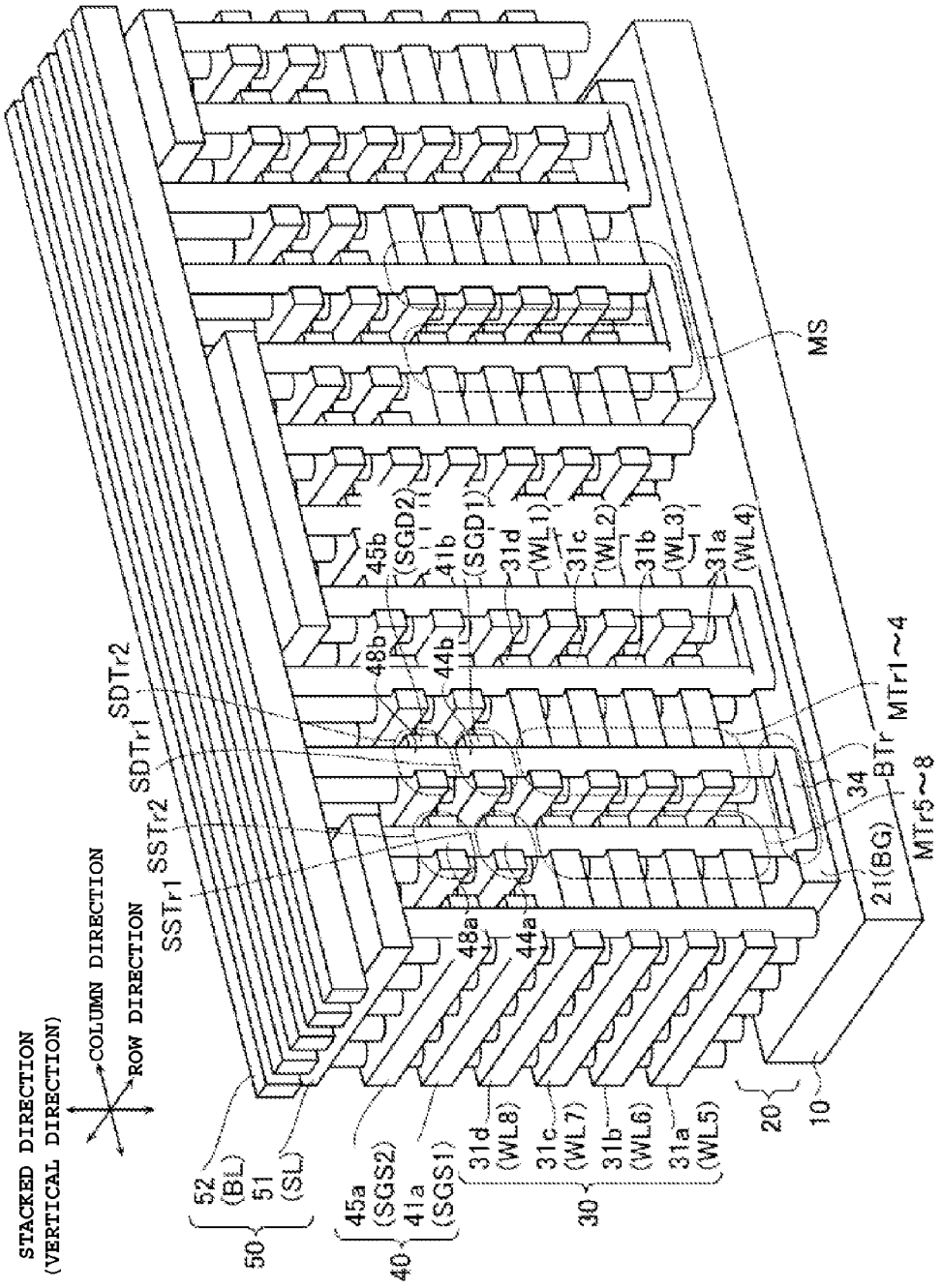
FIG. 2 is an oblique view showing a layered structure of a memory cell array according to the first embodiment.
Figure 3:
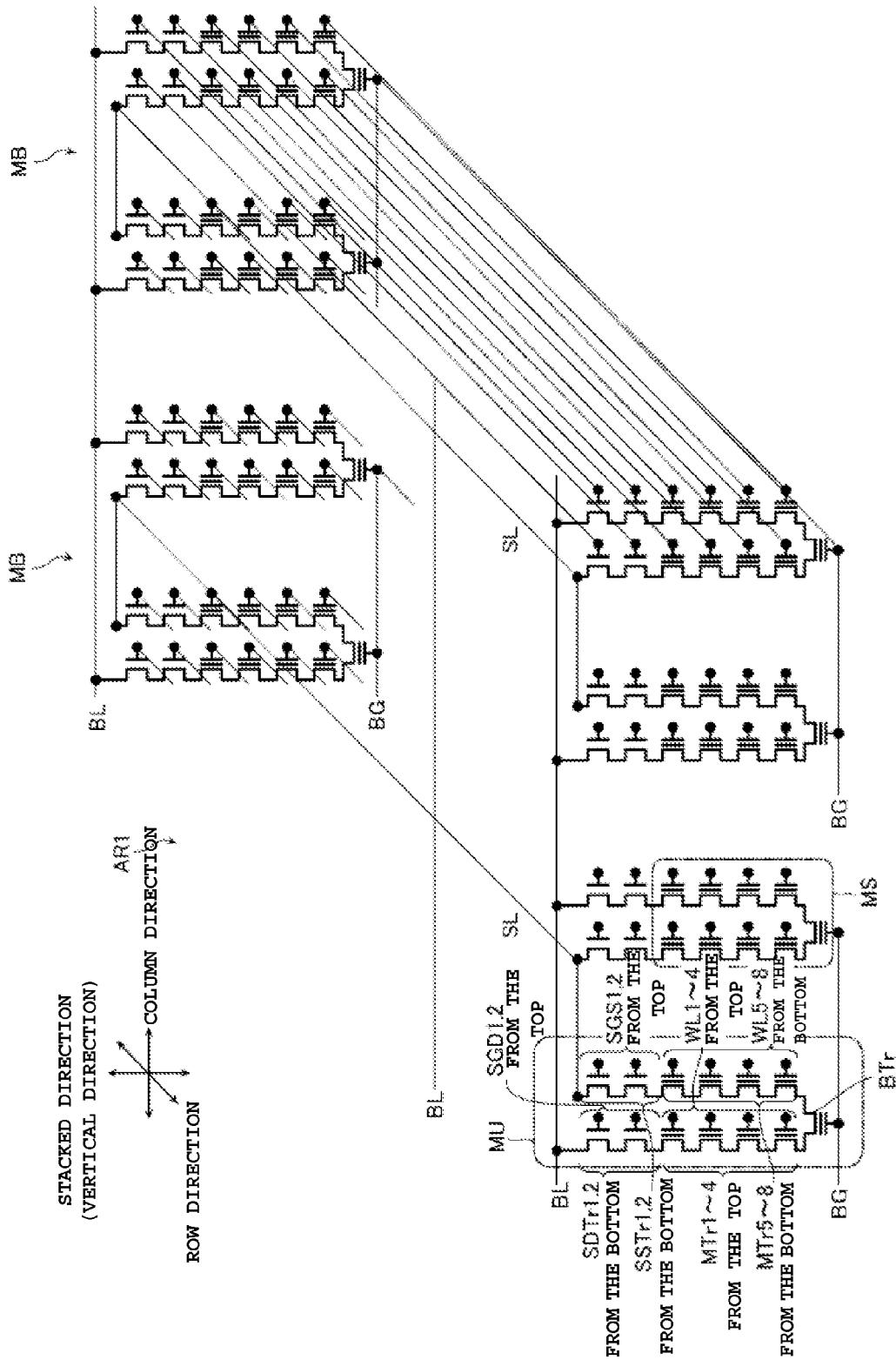
FIG. 3 is a circuit diagram depicting a memory array.

The memory cell array AR1, as shown in FIG. 2, is constituted by memory transistors MTr in a three-dimensional matrix form. In other words, the memory transistors MTr are arrayed in a matrix in the horizontal direction and also arrayed in a layering direction (the direction perpendicular to a substrate, also referred to as the "stacking direction"). Several memory transistors MTr1-8 parallel in the stacking direction are connected in series, constituting memory strings MS. The first and second drain side select transistors SDTr1 and SDTr2 and the first and second source side transistors SSTr1 and SSTr2, which are set to a conductive state when they are selected, are connected to both ends of the memory strings MS. These memory strings MS are extend in the stacking direction as a longitudinal direction. Next, the circuit configuration of the memory cell array AR1 will be explained with reference to FIG. 3. FIG. 3 is an equivalent circuit diagram showing the memory array AR1.

The memory cell array AR1, as shown in FIG. 3, has several bit lines BL and several memory blocks MB. The bit lines BL are arranged at a prescribed pitch in the row direction and formed extending in the column direction as a longitudinal direction. The memory blocks MB are arrayed at a prescribed pitch in the column direction.

The memory blocks MB have several memory units MU arranged in a matrix form in the row direction and the column direction. For the memory block MB, several memory units MU commonly connected are installed in one piece of bit line BL. A memory unit MU has a memory string MS, a first source side select transistor SSTr1, a second source side select transistor SSTr2, a first drain side select transistor SDTr1, and a second drain side select transistor SDTr2. These memory units MU are arranged in a matrix form in the row direction and the column direction.

The memory string MS includes memory transistors MTr1-8 connected in series and a back gate transistor BTr. The memory transistors MTr1-4 are connected in series in the stacking direction. The memory transistors MTr5-8 are similarly connected in series in the stacking direction. In the memory transistors MTr1-8, a threshold voltage is changed by accumulated electric charges stored in charge storage layers. By changing of the threshold voltage, data that are stored in the memory transistors MTr1-8 are rewritten.

A back gate transistor BTr is connected between the memory transistor MTr4 and the memory transistor MTr5. This connection is made on the lowermost layer. Therefore, the memory transistors MTr1-MTr8 and the back gate transistor BTr are connected to form a U shape when viewed in cross section along the column direction.

The drain of the first source side select transistor SSTr1 is connected to one end of the memory string MS (the source of the memory transistor MTr8). The drain of the second source side select transistor SSTr2 is connected to the source of the first source side select transistor SSTr2. The source of the first drain side select transistor SDTr1 is connected to the other end of the memory string MS (the drain of the memory transistor MTr1). The source of the second drain side select transistor SDTr2 is connected to the drain of the first drain side select transistor SDTr1. These transistors SSTr1, 2 and SDTr1, 2 have different threshold voltages due to the amount of electric charges that are accumulated in each charge storage layer.

The gates of n memory transistors MTRrl arranged in one column in the row direction are commonly connected to one word line WL1 extending in the row direction. Similarly, the gates of n memory transistors MTr2-8 arranged in one column in the row direction are respectively, commonly connected to one respective word line WL2-8 extending in the row direction. In addition, the gates of 2×n back gate transistors BTr arranged in a matrix form in the row direction and the column direction are commonly connected to a back gate line BG.

The gates of n first source side select transistors SSTr1 arranged in one column in the row direction are commonly connected to one first source side select gate line SGS1 extending in the row direction. Similarly, the gates of n second source side select transistors SSTr2 arranged in one column in the row direction are commonly connected to one second source side select gate line SGS2 extending in the row direction. In addition, the sources of the second source side select transistors SSTr2 are connected to source lines SL extending in the row direction.

The gates of n first drain side select transistors SDTr1 arranged in one column in the row direction are commonly connected to one first drain side select gate line SGD1 extending in the row direction. The gates of n second drain side select transistors SDTr2 arranged in one column in the row direction are commonly connected to one second drain side select gate line SGD2 extending in the row direction. In addition, the drains of the second drain side select transistors SDTr2 are connected to the bit lines BL extending in the column direction.

Figure 4:
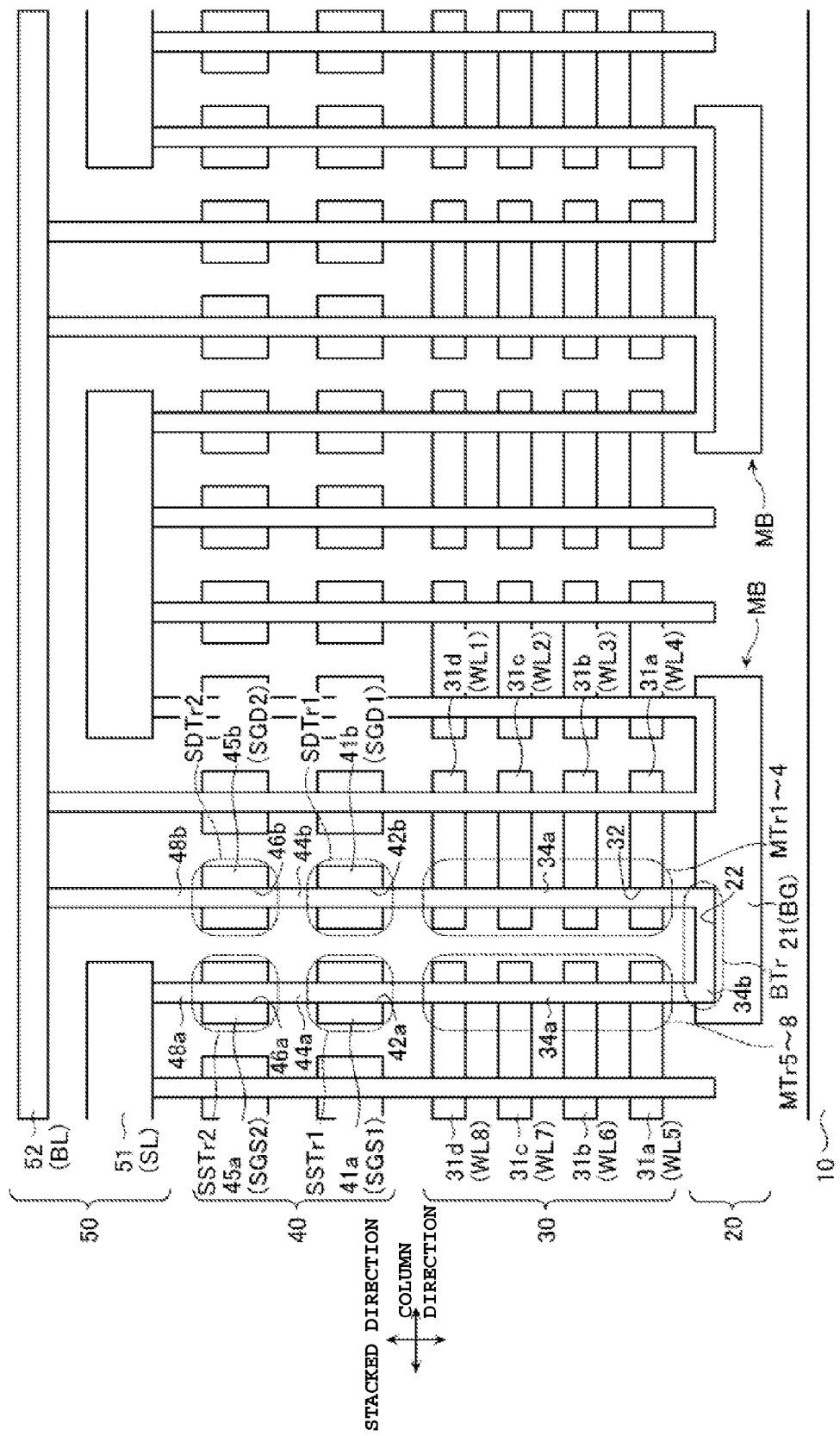
FIG. 4 is a cross section depicting the memory array.
Figure 5:
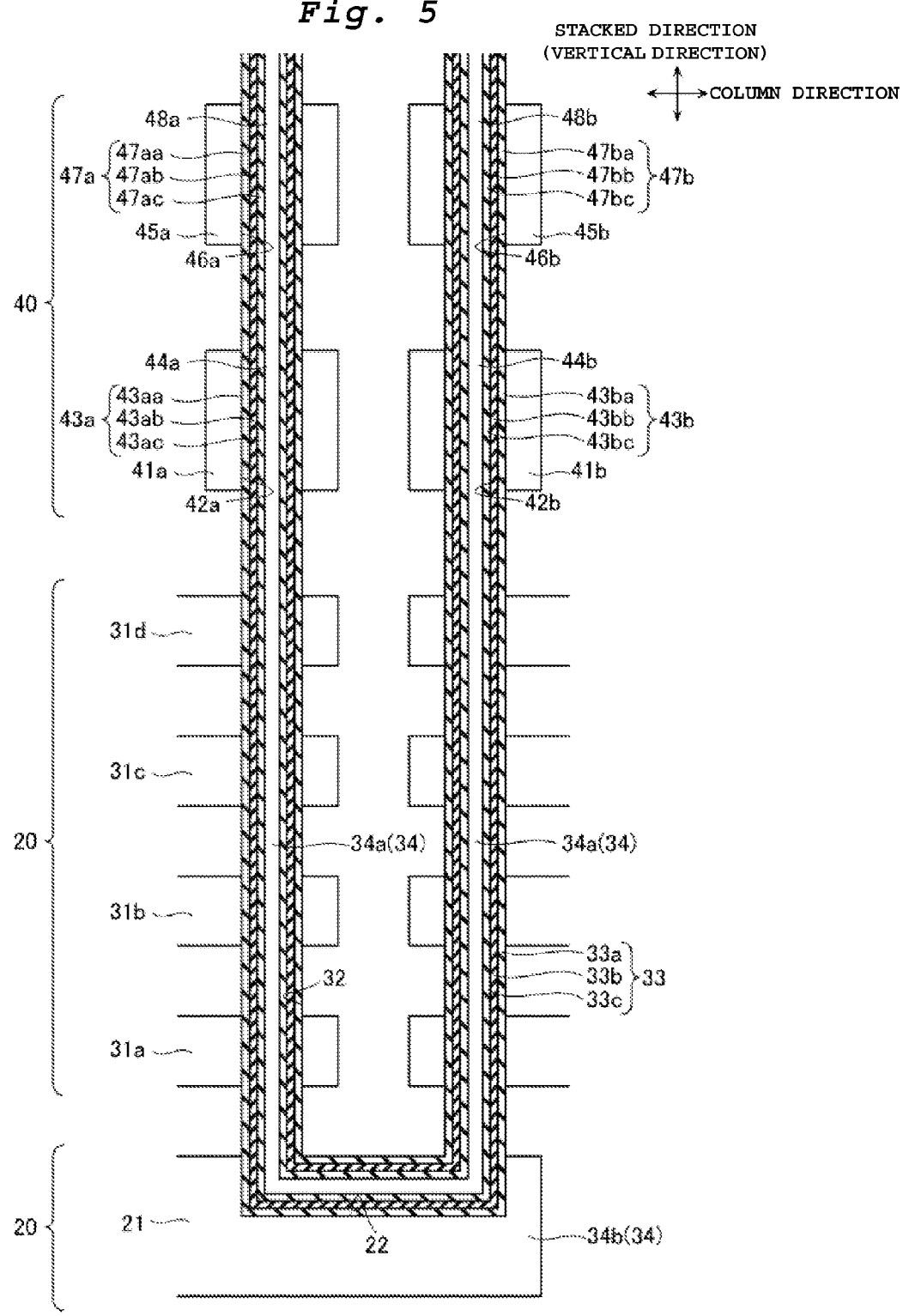
FIG. 5 is a partial enlargement of a portion of FIG. 4.

Next, the layered structure of the nonvolatile semiconductor memory device of the first embodiment will be explained with reference to FIG. 4 and FIG. 5. FIG. 4 is a cross section showing the memory cell array AR1, and FIG. 5 is a partial enlargement of a portion of FIG. 4.

The memory cell array AR1, as shown in FIG. 4, has a back gate transistor layer 20, a memory transistor layer 30, a select transistor layer 40, and a wiring layer 50 on a substrate 10. The back gate transistor layer 20 functions as the back gate transistor BTr. The memory transistor layer 30 functions as the memory transistors MTr1-8 (memory string MS). The select transistor layer 40 functions as the first source side select transistor SSTr1, the second source side select transistor SSTr2, the first drain side select transistor SDTr1, and the second drain side select transistor SDTr2. The wiring layer 50 functions as the source lines SL and the bit lines BL.

The back gate transistor layer 20 has a back gate conducting layer 21. The back gate conducting layer 21 functions as the back gate line BG and functions as the gate of the back gate transistor BTr.

The back gate conducting layer 21 is formed so that it is extends in the row direction and the column direction parallel with the substrate 10. The back gate conducting layer is divided for each memory block MB. The back gate conducting layer 21 is composed of polysilicon (poly-Si), for example.

The back gate conducting layer 20, as shown in FIG. 4, has a back gate holes 22. The back gate holes 22 are formed so that the back gate conducting layer 21 fills them. The back gate hole 22 is formed in an approximate rectangular shape in which the column direction is a longitudinal direction from the top view. The back gate holes 22 are formed in a matrix form in the row direction and the column direction.

The memory transistor layer 30, as shown in FIG. 4, is formed on the upper layer of the back gate conducting layer 20. The memory transistor layer 30 has word line conductive layers 31a-31d. The word line conductive layers 31a-31d, respectively, function both as the word lines WL1-8 and as the gates of the memory transistors MTr1-8.

The word line conductive layers 31a-31d are layered via an interlayer dielectric (not shown in the drawing). The word line conductive layers 31a-31d are formed so that they have a prescribed pitch in the column direction and extend in the row direction as a longitudinal direction. The word line conductive layers 31a-31d are composed of polysilicon (poly-Si).

The memory transistor layer 30, as shown in FIG. 4, has a memory hole 32. The memory hole 32 is formed so that it penetrates through the word line conductive layers 31a-31d and the interlayer dielectric (which is not depicted in the drawing). The memory hole 32 is formed so that it is matched with the end vicinity in the column direction of the back gate hole 22.

In addition, the back gate transistor layer 20 and the memory transistor layer 30, as shown in FIG. 5, have a memory gate insulating layer 33 and a memory semiconductor layer 34. The memory semiconductor layer 34 functions as the body of the memory transistors MTr1-MTr8 (memory string MS).

The memory gate insulating layer 33, as shown in FIG. 5, is formed at a prescribed thickness on the side surfaces of the back gate hole 22 and the memory hole 32. The memory gate insulating layer 33 has a block insulating layer 33a, a charge storage layer 33b, and a tunnel insulating layer 33c. As electric charges are accumulated in the charge storage layer 33b, the threshold voltage of the memory transistors MTr1-8 is changed, rewriting data that are held in the memory transistor MTr.

The block insulating layer 33a, as shown in FIG. 5, is formed at a prescribed thickness on the side surfaces of the back gate hole 22 and the memory hole 32. The charge storage layer 33b is formed at a prescribed thickness on the side surface of the block insulating layer 33a. The tunnel insulating layer 33c is formed at a prescribed thickness on the side surface of the charge storage layer 33b. The block insulating layer 33a and the tunnel insulating layer 33c are composed of a silicon dioxide ($SiO_2$). The charge storage layer 33b is composed of a silicon nitride (SiN). Those skilled in the art will recognize that other materials may be suitable for the insulation and storage layers.

The memory semiconductor layer 34 is formed so that it is in contact with the side surface of the tunnel insulating layer 33c. The memory semiconductor layer 34 is formed so that the back gate hole 22 and the memory hole 33 are buried in it. The memory semiconductor layer 34 is formed in a U shape in the row direction. The memory semiconductor layer 34 has a pair of columnar parts 34a extending in the direction perpendicular to the substrate 10 and a connecting part 34b for connecting the lower ends of a pair of columnar parts 34a. The memory semiconductor layer 34 is composed of poly-silicon (poly-Si).

In other words, in the constitution of the back gate transistor layer 20, the memory gate insulating layer 33 is formed so that it surrounds the connecting part 34b. The back gate conducting layer 21 is formed so that it encloses the connecting part 34b via the memory gate insulating layer 33. In addition, in the constitution of the memory transistor layer 30, the memory gate insulating layer 33 is formed so that it encloses the columnar part 34a. The word line conductive layers 31a-31d are formed so that they surround the columnar part 34a via the memory gate insulating layer 33.

The select transistor layer 40, as shown in FIG. 4, has a first source side conductive layer 41a and a first drain side conductive layer 41b. The first source side conductive layer 41a functions as the first source side select gate line SGS1 and functions as the gate of the first source side select transistor SSTr1. The first drain side conductive layer 41b functions as the first drain side select gate line SGD1 and functions as the gate of the first drain side select transistor SDTr1.

The first source side conductive layer 41a is formed on the upper layer of one columnar part 34a constituting the memory semiconductor layer 34, and the first drain side conductive layer 41b is the same layer as the first source side conductive layer 41a and is formed on the upper layer of the other columnar part 34a constituting the memory semiconductor layer 34. The first source side conductive layer 41a and the first drain side conductive layer 41b is formed in a stripe shape that has a prescribed pitch in the column direction and extends in the row direction. The first source side conductive layer 41a and the first drain side conductive layer 41b are composed of polysilicon (poly-Si).

The select transistor layer 40, as shown in FIG. 4, has the first source side hole 42a and the first drain side hole 42b. The first source side hole 42a is formed so that it penetrates through the first source side conductive layer 41a. The first drain side hole 42b is formed so that it penetrates through the first drain side conductive layer 41b. The first source side hole 42a and the first drain side hole 42b are, respectively, formed at the positions matching with the memory hole 32.

The select transistor layer 40, as shown in FIG. 5, has a first source side gate insulating layer 43a, a first source side columnar semiconductor layer 44a, a first drain side gate insulating layer 43b, and a first drain side columnar semiconductor layer 44b. The first source side columnar semiconductor layer 44a functions as the body of the first source side select transistor layer SSTr1. The first drain side columnar semiconductor layer 44b functions as the body of the first drain side columnar semiconductor layer SDTr1.

The first source side gate insulating layer 43a is formed at a prescribed thickness on the side surface of the first source side hole 42a. The first source side gate insulating layer 43a has a block insulating layer 43aa, a charge storage layer 43ab, and a tunnel insulating layer 43ac. The charge storage layer 43ab is a layer having a function of accumulating electric charges.

The block insulating layer 43aa, as shown in FIG. 5, is formed at a prescribed thickness on the side surface of the first source side hole 43a. The block insulating layer 43aa is continuously formed integrally with the block insulating layer 33a. The charge storage layer 43ab is formed at a prescribed thickness on the side surface of the block insulating layer 43aa. The charge storage layer 43ab is continuously formed integrally with the charge storage layer 33b. The tunnel insulating layer 43ac is formed at a prescribed thickness on the side surface of the charge storage layer 43ab. The tunnel insulating layer 43ac is continuously formed integrally with the tunnel insulating layer 33c. The block insulating layer 43aa and the tunnel insulating layer 43ac are composed of a silicon dioxide ($SiO_2$). The charge storage layer 43ab is composed of a silicon nitride (SiN).

The first source side columnar semiconductor layer 44a contacts with the side surface of the first source side gate insulating layer 43a and the upper surface of one of a pair of columnar part 34a and is formed in a columnar shape so that it extends in the direction perpendicular to the substrate 10. The first source side columnar semiconductor layer 44a is formed so that the first source side hole 42a is buried in it. The first source side columnar semiconductor layer 44a is continuously formed integrally with the columnar part 34a. The first source side columnar semiconductor layer 44a is composed of polysilicon (poly-Si).

The first drain side gate insulating layer 43b is formed at a prescribed thickness on the side surface of the first drain side hole 42b. The first drain side gate insulating layer 43b has a block insulating layer 43ba, a charge storage layer 43bb, and a tunnel insulating layer 43bc. The charge storage layer 43bb changes the threshold voltage of the first drain side select transistor SDTr1 by accumulating electric charges.

The block insulating layer 43ba, as shown in FIG. 5, is formed at a prescribed thickness on the side surface of the first drain side hole 43b. The block insulating layer 43ba is continuously formed integrally with the block insulating layer 33a. The charge storage layer 43bb is formed at a prescribed thickness on the side surface of the block insulating layer 43*ba*. The charge storage layer 43*bb* is continuously formed integrally with the charge storage layer 43*bb*. The tunnel insulating layer 43*bc* is formed at a prescribed thickness at the side surface of the charge storage layer 43*bb*. The tunnel insulating layer 43*bc* is continuously formed integrally with the tunnel insulating layer 33*c*. The block insulating layer 43*ba* and the tunnel insulating layer 43*bc* are composed of silicon dioxide ($SiO_2$). The charge storage layer 43*bb* is composed of silicon nitride (SiN).

The first drain side columnar semiconductor layer 44*b* is in contact with the side surface of the first drain side gate insulating layer 43*b* and the upper surface of the other of a pair of columnar parts 34*a* and is formed in a columnar shape so that it extends in the direction perpendicular to the substrate 10. The first drain side columnar semiconductor layer 44*b* is formed so that the first drain side hole 42*b* is buried in it. The first drain side columnar semiconductor layer 44*b* is continuously formed integrally with the columnar part 34*a*. The first drain side columnar semiconductor layer 44*b* is composed of polysilicon (poly-Si).

In addition, the select transistor layer 40, as shown in FIG. 4, has a second source side conductive layer 45*a* and a second drain side conductive layer 45*b*. The second source side conductive layer 45*a* functions as the second source side select gate line SGS2 and functions as the gate of the second source side select transistor SSTr2. The second drain side conductive layer 45*b* functions as the second drain side select gate line SGD2 and functions as the gate of the second drain side select transistor SDTr2.

The second source side conductive layer 45*a* is formed on the upper layer of the first source side conductive layer 41*a*. The second drain side conductive layer 45*b* is the same layer as the second source side conductive layer 45*a* and is formed on the upper layer of the first drain side conductive layer 41*b*. The second source side conductive layer 45*a* and the second drain side conductive layer 45*b* are composed of polysilicon (poly-Si).

The select transistor layer 40, as shown in FIG. 4, has a second source side hole 46*a* and a second drain side hole 46*b*. The second source side hole 46*a* is formed so that it penetrates through the second source side conductive layer 45*a*. The second source side hole 46*a* is formed at the position matching with the first source side hole 42*a*. The second drain side hole 46*b* is formed so that it penetrates through the second drain side conductive layer 45*b*. The second drain side hole 46*b* is formed at the position matching with the first drain side hole 42*b*.

The select transistor layer 40, as shown in FIG. 5, has a second source side gate insulating layer 47*a*, a second source side columnar semiconductor layer 48*a*, a second drain side gate insulating layer 47*b*, and a second drain side columnar semiconductor layer 48*b*. The second source side columnar semiconductor layer 48*a* functions as the body of the second source side select transistor SSTr2. The second drain side columnar semiconductor layer 48*b* functions as the body of the second drain side columnar semiconductor layer SDTr2.

The second source side gate insulating layer 47*a* is formed at a prescribed thickness on the side surface of the second source side hole 46*a*. The second source side gate insulating layer 47*a* has a block insulating layer 47*aa*, a charge storage layer 47*ab*, and a tunnel insulating layer 47*ac*. The charge storage layer 47*ab* changes the threshold voltage of the second source side select transistor SSTr2 by accumulating electric charges.

The block insulating layer 47*aa*, as shown in FIG. 5, is formed at a prescribed thickness on the side surface of the second source side hole 46*a*. The block insulating layer 47*aa* is continuously formed integrally with the block insulating layer 43*aa*. The charge storage layer 47*ab* is formed at a prescribed thickness on the side surface of the block insulating layer 47*aa*. The charge storage layer 47*ab* is continuously formed integrally with the charge storage layer 43*ab*. The tunnel insulating layer 47*ac* is formed at a prescribed thickness on the side surface of the charge storage layer 47*ab*. The tunnel insulating layer 47*ac* is continuously formed integrally with the tunnel insulating layer 43*ac*. The block insulating layer 47*aa* and the tunnel insulating layer 47*ac* are composed of silicon dioxide ($SiO_2$). The charge storage layer 47*ab* is composed of silicon nitride (SiN).

The second source side columnar semiconductor layer 48*a* is in contact with the side surface of the second source side gate insulating layer 47*a* and the upper surface of the first source side columnar semiconductor layer 44*a* and is formed in a columnar shape so that it extends in the direction perpendicular to the substrate 10. The second source side columnar semiconductor layer 48*a* is formed so that the second source side hole 46*a* is buried in it. The second source side columnar semiconductor layer 48*a* is continuously formed integrally with the first source side columnar semiconductor layer 44*a*. The second source side columnar semiconductor layer 48*a* is composed of polysilicon (poly-Si).

The second drain side gate insulating layer 47*b* is formed at a prescribed thickness on the side surface of second drain side hole 46*b*. The second drain side gate insulating layer 47*b* has a block insulating layer 47*ba*, a charge storage layer 47*bb*, and a tunnel insulating layer 47*bc*. The charge storage layer 47*bb* changes the threshold voltage of the second drain side select transistor SDTr2 by accumulating electric charges.

Therefore, the drain side select transistors SDTr1, SDTr2, SSTr1, and SSTr2 have the charge storage layers 43*ab*, 43*bb*, 47*ab*, and 47*bb* similar to those of the memory transistors MTr and can change threshold voltage by changing the amount of electric charges that are accumulated in the charge storage layer.

Select transistors generally are not required to have a charge storage layer. However, in this embodiment, these select transistors have the charge storage layer, which helps simplify manufacturing process flows and thus reduce manufacturing costs. In other words, when the select transistors are formed without a charge storage layer, the number of process different steps is increased, rather than simply repeating the same process steps multiple times. Accordingly, in this embodiment, after the conductive layers 31*a*-31*d*, the conductive layers 41*a*, 41*b*, 45*a*, and 45*b*, and the interlayer dielectric sandwiched between these layers, which is not shown in the drawing, are layered, a U-shaped hole is formed, and a silicon oxide film, a silicon nitride film (charge storage layer), and a silicon oxide film are sequentially deposited on the wall surface of the hole, though it is not shown in the drawing, thus obtaining a structure as shown in FIG. 5.

However, when the gate insulating layer of the select transistors has a charge storage layer, holes or electrons may be trapped in this charge storage layer during a write operation or readout operation on the memory cells, causing a concern that the threshold voltage of the select transistors is accidentally changed during these steps. For this reason, in this embodiment, the control circuit AR2 is configured so that an adjusting operation (quasi-write operation) of the threshold voltage for the select transistors can be implemented to alter/control the threshold voltage of the select transistors.

The block insulating layer 47*ba*, as shown in FIG. 5, is formed at a prescribed thickness on the side surface of the second drain side hole 46*b*. The block insulating layer 47*ba* is continuously formed integrally with the block insulating layer 43*ba*. The charge storage layer 47*bb* is formed at a prescribed thickness on the side surface of the block insulating layer 47*ba*. The charge storage layer 47*bb* is continuously formed integrally with the charge storage layer 43*bb*. The tunnel insulating layer 47*bc* is formed at a prescribed thickness on the side surface of the charge storage layer 47*bb*. The tunnel insulating layer 47*bc* is continuously formed integrally with the tunnel insulating layer 43*bc*. The block insulating layer 47*ba* and the tunnel insulating layer 47*bc* are composed of silicon dioxide ($SiO_2$). The charge storage layer 47*bb* is composed of silicon nitride (SiN).

The second drain side columnar semiconductor layer 48*b* is in contact with the side surface of the second drain side gate insulating layer 47*b* and the upper surface of the first drain side columnar semiconductor layer 44*b* and is formed in a columnar shape so that it extends in the direction perpendicular to the substrate 10. The second drain side columnar semiconductor layer 48*b* is formed so that the second drain side hole 46*b* is buried in it. The second drain side columnar semiconductor layer 48*b* is continuously formed integrally with the first drain side columnar semiconductor layer 44*b*. The second drain side columnar semiconductor layer 48*b* is composed of polysilicon (poly-Si), for example.

In other words, in the constitution of the select transistor layer 40, the first source side gate insulating layer 43*a* is formed so that it encloses the first source side columnar semiconductor 44*a*. The first source side conductive layer 41*a* is formed so that it encloses the first source side columnar semiconductor layer 44*a* via the first source side gate insulating layer 43*a*. The first drain side gate insulating layer 43*b* is formed so that it encloses the first drain side columnar semiconductor layer 44*b*. The first drain side conductive layer 41*b* is formed so that it encloses the first drain side columnar semiconductor layer 44*b* via the first drain side gate insulating layer 43*b*.

In addition, in the constitution of the select transistor layer 40, the second source side gate insulating layer 47*a* is formed so that it encloses the second source side columnar semiconductor layer 48*a*. The second source side conductive layer 45*a* is formed so that it encloses the second source side columnar semiconductor layer 48*a* via the second source side gate insulating layer 47*a*. The second drain side gate insulating layer 47*b* is formed so that it encloses the second drain side columnar semiconductor layer 48*b*. The second drain side conductive layer 45*b* is formed so that it encloses the second drain side columnar semiconductor layer 48*b* via the second drain side gate insulating layer 47*b*.

The wiring layer 50, as shown in FIG. 4, is formed on the upper layer of the select transistor layer 40. The wiring layer 50 has a source line layer 51 and a bit line layer 52. The source line layer 51 functions as the source lines SL, and the bit line layer 52 functions as the bit lines BL.

The source line layer 51 is formed in a planar (plate) shape extending in the row direction. The source line layer 51 is formed so that it is in contact with the upper surface of a pair of second source side columnar semiconductor layers 48*a* adjacent in the column direction. The bit line layer 52 is in contact with the upper surface of the second drain side columnar semiconductor layer 48*b* and is formed in stripes with a prescribed pitch in the row direction and extending in the column direction. The source line layer 51 and the bit line layer 52 are composed of metal such as tungsten (W).

Figure 6:
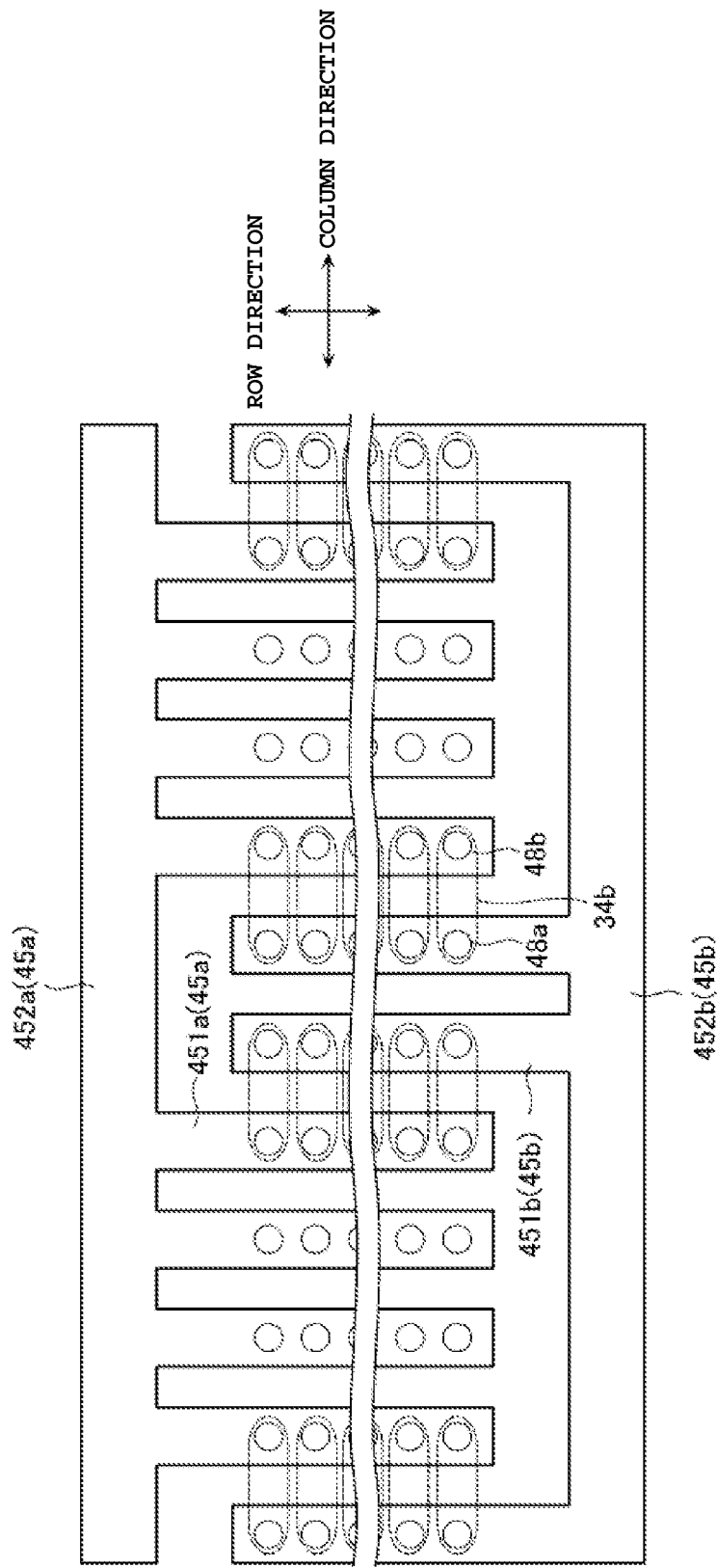
FIG. 6 is a top view depicting a second source side conductive layer and a second drain side conductive layer.

Next, the shape of the second source side conductive layer 45*a* and the second drain side conductive layer 45*b* will be explained in detail with reference to FIG. 6. FIG. 6 is a top view showing the second source side conductive layer 45*a* and the second drain side conductive layer 45*b*.

The second source side conductive layer 45*a* and the second drain side conductive layer 45*b*, as shown in FIG. 6, are respectively formed in a comb shape from the vertical direction. The second source side conductive layer 45*a* includes several straight line parts 451*a*, which enclose several second source side columnar semiconductor layers 48*a* parallel in the row direction, and a straight line part 452*a* for connecting the ends of several straight line parts 451*a*. Similarly, the second drain side conductive layer 45*b* includes several straight line parts 451*b*, which enclose several second drain side columnar semiconductor layers 48*b* parallel in the row direction, and a straight line part 452*b* for connecting the ends of several straight line parts 451*b*. As shown in FIG. 6, four straight line parts 451*a* and two straight line parts 451*b* are installed in an alternate fashion in the column direction.

Figure 7:
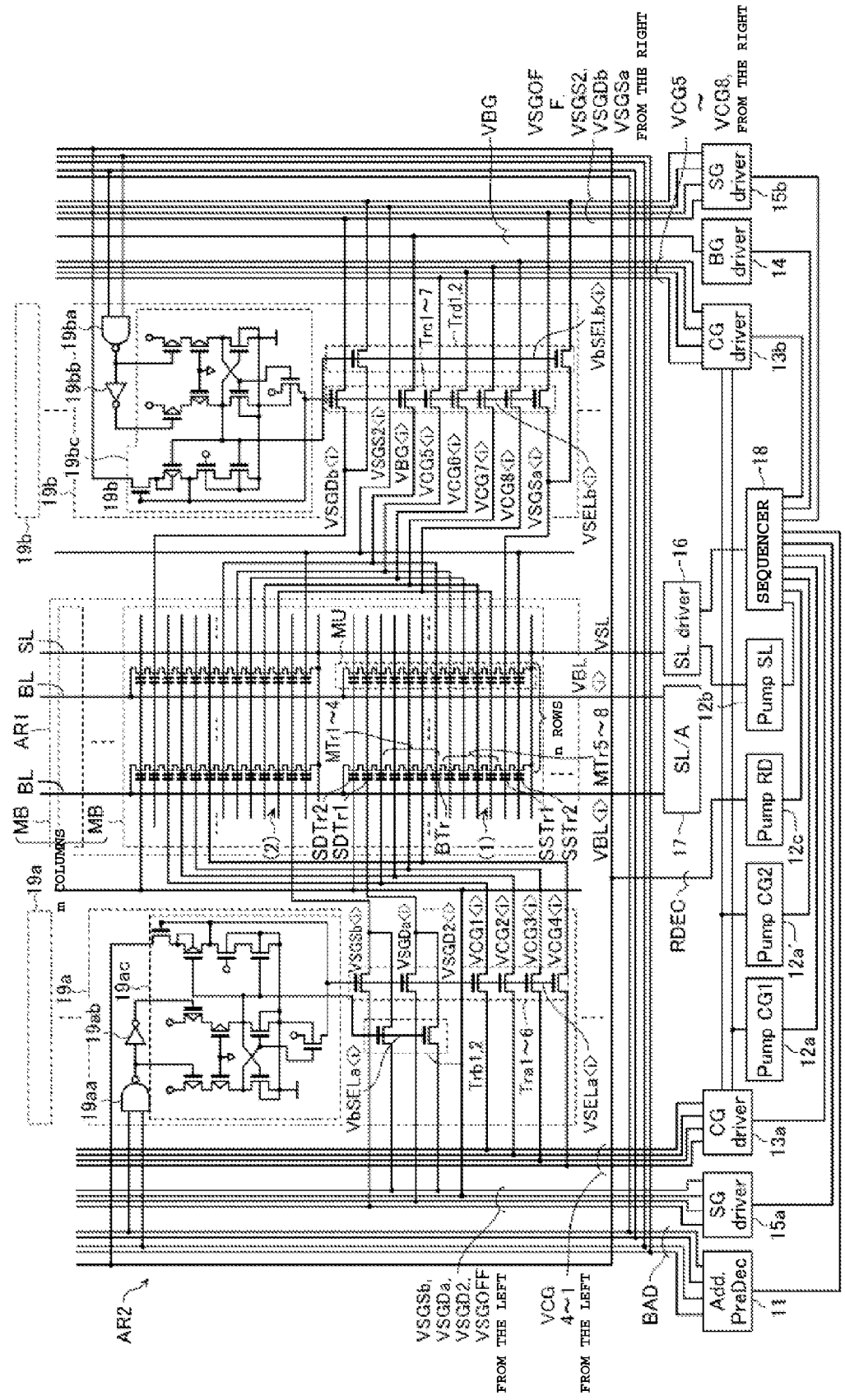
FIG. 7 is a circuit diagram depicting a control circuit.

Next, a detailed constitution of the control circuit AR2 will be explained with reference to FIG. 7. FIG. 7 is a circuit diagram showing a detailed constitution of the control circuit AR2. The control circuit AR2, as shown in FIG. 7, has an address decoder circuit 11, step-up circuits 12*a*, 12*a'*, 12*b*, and 12*c*, word line drive circuits 13*a* and 13*b*, a back gate line drive circuit 14, select gate line drive circuits 15*a* and 15*b*, a source line drive circuit 16, a sense amplifier circuit 17, a sequencer 18, and row decoder circuits 19*a* and 19*b*.

The address decoder circuit 11, as shown in FIG. 7, outputs a signal BAD to the row decoder circuits 19*a* and 19*b*. The signal BAD is a signal for designating the memory block MB (block address).

The step-up circuits 12*a*, 12*a'*, 12*b*, and 12*c* generate a step-up voltage in which a reference voltage has been stepped up. In the step-up circuits 12*a* and 12*a'*, as shown in FIG. 7, the stepped-up voltage is transferred to the word line drive circuits 13*a* and 13*b*. The step-up circuits 12*a* and 12*a'* respectively generate different voltages. The former generates a voltage that is supplied to selected word lines, and the latter generates a voltage that is supplied to non-selected word lines. For example, in a readout operation, the step-up circuit 12*a* generates a read voltage $V_{CGRV}$, which is applied to selected word lines, and the step-up circuit 12*a'* generates a read path voltage Vread that is applied to non-selected word lines. The read voltage $V_{CGRV}$ is a voltage between the upper limit and the lower limit of several threshold voltage distributions, and the read pass voltage Vread is a voltage that is higher than the upper limit of the maximum threshold voltage distribution and can conduct the memory cells, regardless of held data of the memory cells. On the other hand, in a write operation, the step-up circuit 12*a* generates a program voltage Vpgm (for example, 20 V or higher) that is applied to selected word lines, and the step-up circuit 12*a'* generates a write pass voltage Vpass (about 8-10 V) that is applied to the non-selected word lines. The write voltage Vpgm is a voltage with a magnitude great enough for generating a tunnel current, which injects electrons into a floating gate of the memory cells, when 0 V is applied to a channel. On the other hand, the write pass voltage Vpass is a voltage with a magnitude insufficient for injecting electrons into the floating gate, even when 0 V is applied to the channel.

In addition, the step-up circuit 12*b* outputs a stepped-up voltage to the source line drive circuit 16. The step-up circuit 12*c* outputs a stepped-up signal RDEC to the row decoder circuits 19*a* and 19*b*.

The word line drive circuit 13*a*, as shown in FIG. 7, outputs signals VCG1-4. The word line drive circuit 13*b* outputs signals VCG5-8. The signals VCG1-8 are used in driving the word lines WL1-8 of a select memory block MB<i>.

The back gate line drive circuit 14, as shown in FIG. 7, outputs a signal VBG. The signal VBG is used in driving the back gate line BG of the select memory block MB<i>.

The select gate line drive circuit 15a, as shown in FIG. 7, outputs signal VSGSb, signal VSGDa, signal VSGD2, and signal VSGOFF. The select gate line drive circuit 15b outputs signal VSGSa, signal VSGDb, signal VSGS2, and signal VSGOFF. The signal VSGSa and the signal VSGSb are respectively used in driving the first source side select gate line SGS1 of the first column and the second column of the select memory block MB<i>. Signal VSGDa and signal VSGDb are respectively used in driving the first drain side select gate line SGD1 of the first column and the second column of the select memory block MB<i>. The signal VSGS2 is used in driving the second source side select gate line SGS2 of the select memory block MB<i>. The signal VSGD2 is used in driving the second drain side select gate line SGD2 of the select memory block MB<i>. The signal VSGOFF is used in driving the first source side select gate line SGS1 and the first drain side select gate line SGD1 of the nonselect memory block MB<i>.

Here, the signal VSGSb, signal VSGDa, and signal VSGOFF are input into various kinds of wirings via the row decoder circuit 19a from the select gate line drive circuit 15a. On the other hand, the signal VSGD2 is directly input as a signal VSGD2<i> into the gate of the second drain side select transistor SDTr2 from the select gate line drive circuit 15a. In addition, the signal VSGOFF, signal VSGDb, and signal VSGSa are input into various kinds of wirings via the row decoder circuit 19b from the select gate line drive circuit 15b. On the other hand, the signal VSGS2 is directly input as a signal VSGS2<i> into the gate of the second source side select transistor SSTr2 from the select gate line drive circuit 15b. Moreover, the signals VSGS2 and VSGD2 are supplied as the common signals over several memory blocks MB.

The source line drive circuit 16, as shown in FIG. 7, outputs a signal VSL. The signal VSL is used in driving the source lines SL.

The sense amplifier circuit 17, as shown in FIG. 7, charges a prescribed bit line BL up to a prescribed voltage by outputting a signal VBL<i> and then decides held data of the memory transistor MTr in the memory string MS based on the change of the voltage of the bit lines BL. In addition, the sense amplifier circuit 17 outputs the signal VBL<i> corresponding to the write data to the prescribed bit line BL.

The sequencer 18, as shown in FIG. 7, supplies a control signal to the circuits 11-17 and controls these circuits.

One each of the row decoder circuits 19a and 19a, as shown in FIG. 5, is respectively installed for one memory block MB. The row decoder circuit 19a inputs signal VCG1<i>-VCG4<i> into the gates of the memory transistors MTr1-MTr4 based on the signal BAD and the signals VCG1-VCG4. In addition, the row decoder circuit 19a selectively inputs a signal VSGSb<i> into the gate of the first source side select transistor SSTr1 of the second column of the memory units MU based on the signals BAD, VSGSb, and SGOFF. Moreover, the row decoder circuit 19a selectively inputs a signal VSGDa<i> into the gate of the first drain side select transistor SDTr1 of the first column of the memory units MU based on the signals BAD, VSGDa, and SGOFF.

The row decoder circuit 19a has a NAND circuit 19aa, a NOT circuit 19ab, a voltage converting circuit 19ac, first transfer transistors Tra1-Tra6, and second transfer transistors Trb1 and Trb2. The voltage converting circuit 19ac generates a signal VSELa<i> based on the signals BAD and RDEC received via the NAND circuit 19aa and the NOT circuit 19ab and outputs the signal to the gates of the first transfer transistors Tra1-Tra6. In addition, the voltage converting circuit 19ac generates a signal VbSELa<i> based on the signals BAD and RDEC and outputs the signal to the gates of the second transfer transistors Trb1 and Trb2.

The first transfer transistors Tra1-Tra4 are connected between the word line drive circuit 13a and each word line WL1-WL4. The first transfer transistors Tra1-Tra4 output the signals VCG1<i>-VCG4<i> to the word lines WL1-WL4 based on the signals VCG1-VCG4 and VSELa<i>. The first transfer transistor Tra5 is connected between the select gate line drive circuit 15a and the first source side select gate line SGS1 of the second column of the memory units MU. The first transfer transistor Tra5 outputs the signal VSGSb<i> to the first source side select gate line SGS1 of the second column of the memory units MU based on the signals VSGSb and VSELa<i>. The first transfer transistor Tra6 is connected between the select gate line drive circuit 15a and the first drain side select gate line SGD1 of the first column of the memory units MU. The first transfer transistor Tra6 outputs the signal VSGDa<i> to the first drain side select gate line SGD1 of the first column of the memory unit MU based on the signals VSGDa and VSELa<i>.

The second transfer transistor Trb1 is connected between the select gate line drive circuit 15a and the second column of the first source side select gate line SGS1. The second transfer transistor Trb1 outputs the signal VSGSb<i> to the first source side select gate line SGS1 of the second column of the memory units MU based on the signals VSGOFF and VbSELa<i>. The second transfer transistor Trb2 is connected between the select gate line drive circuit 15a and the drain side select gate line SGD of the first column of the memory units MU. The second transfer transistor Trb2 outputs the signal VSGDa<i> to the first drain side select gate line SGD1 of the first column of the memory unit MU based on the signals VSGOFF and VbSELa<i>.

The row decoder circuit 19b inputs signals VCG5<i>-VCG8<i> into the gates of the memory transistors MTr5-MTr8 based on the signals BAD and VCG5-VCG8. In addition, the row decoder circuit 19b selectively inputs a signal VSGSa<i> into the gate of the first source side selective SSTr1 of the first column of the memory unit MU based on the signals BAD, VSGSa, and SGOFF. In addition, the row decoder circuit 19b selectively inputs a signal VSGDb<i> into the gate of the first drain side select transistor SDTr1 of the second column of the memory units MU based on the signals BAD, VSGDb, and SGOFF.

The row decoder circuit 19b has a NAND circuit 19ba, a NOT circuit 19bb, a voltage converting circuit 19bc, first transfer transistors Trc1-Trc7, and second transfer transistors Trd1 and Trd2. The voltage converting circuit 19bc generates a signal VSELb<i> based on the signals BAD and RDEC received via the NAND circuit 19ba and the NOT circuit 19bb, and outputs the signal to the gates of the first transfer transistors Trc1-Trc7. Moreover, the voltage converting circuit 19bc generates a signal VbSELb<i> based on the signals BAD and RDEC, and outputs the signal to the gates of the second transfer transistors Trd1 and Trd2.

The first transfer transistors Trc1-Trc4 are connected between the word line drive circuit 13b and each word line WL5-WL8. The first transfer transistors Trc1-Trc4 output the signals VCG5<i>-VCG8<i> to the word lines WL5-WL8 based on the signals VCG5-VCG8 and VSELb<i>. The first transfer transistor Trc5 is connected between the back gate line drive circuit 14 and the back gate line BG. The first transfer transistor Trc5 outputs a signal VBG<i> to the back gate line BG based on the signals VBG and VSELb<i>. The first transfer transistor Trc6 is connected between the select gate line drive circuit 15b and the first source side select gate line SGS1 of the first column of the memory units MU. The first transfer transistor Trc6 outputs a signal VSGSa<i> to the first source side select gate line SGS1 of the first column of the memory units MU based on the signals VSGSa and VSELb<i>. The first transfer transistor Trc7 is connected between the select gate line drive circuit 15b and the first drain side select gate line SGD1 of the second column of the memory units MU. The first transfer transistor Trc7 outputs a signal VSGDb<i> to the first drain side select gate line SGD1 of the second column of the memory units MU based on the signals VSGDb and VSELb<i>.

The second transfer transistor Trd1 is connected between the select gate line drive circuit 15b and the first source side select gate line SGS1 of the first column of the memory units MU. The second transfer transistor Trd6 outputs the signal VSGSa<i> to the first source side select gate line SGS1 of the first column of the memory units MU based on the signals VSGOFF and VbSELb<i>. The second transfer transistor Trd2 is connected between the select gate line drive circuit 15b and the first drain side select gate line SGD1 of the second column of the memory units MU. The second transfer transistor Trd2 outputs the signal VSGDb<i> to the first drain side select gate line SGD1 of the second column of the memory units MU based on the signals VSGOFF and VbSELb<i>.

Next, a detailed circuit configuration of the step-up circuit 12a of this embodiment will be explained with reference to FIG. 8. Here, the other step-up circuits 12a', 12b, and 12c have constitutions shown in FIG. 9; however, in the following examples, it is assumed that only the step-up circuit 12a has the constitution of FIG. 8.

Figure 8:
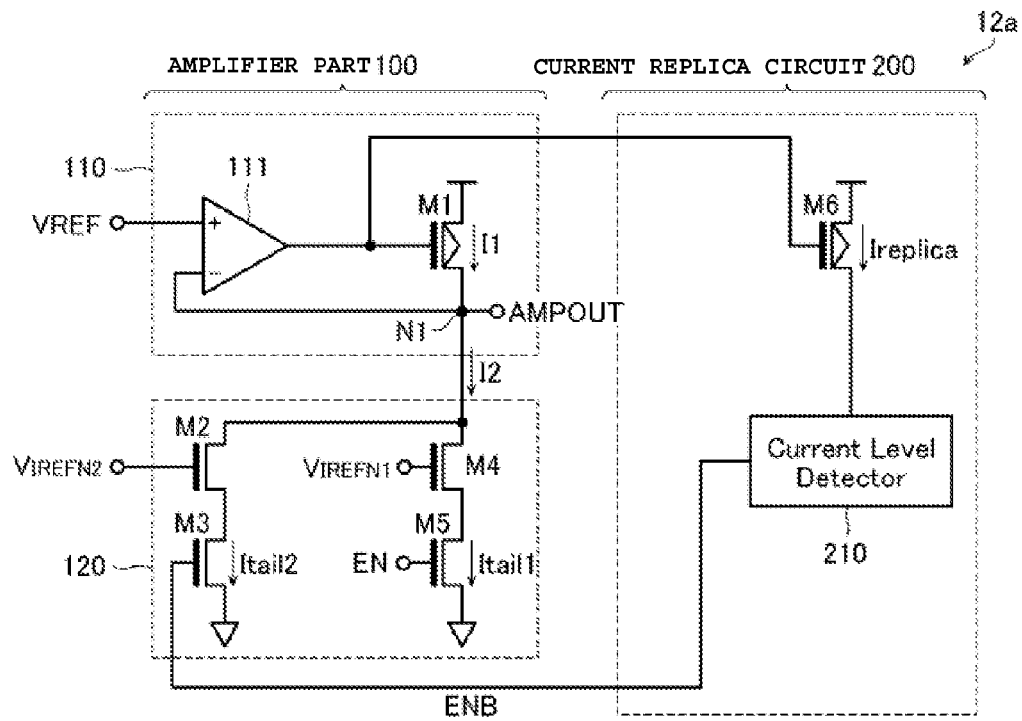
FIG. 8 is a circuit diagram depicting a step-up circuit according to the first embodiment.

As shown in FIG. 8, the step-up circuit 12a is provided with an amplifier part (module) 100 and a current replica circuit 200. The amplifier part 100 generates a step-up voltage, which is supplied to the word lines WL, based on a power supply voltage. The current replica circuit 200 generates a replica current Ireplica proportional to a current flowing in the amplifier part (module) 100 and controls the amplifier part 100 based on the replica current Ireplica.

The amplifier part 100 is provided with a charging circuit 110 and a discharging circuit 120. The charging circuit 110 includes a PMOS transistor M1 and a differential amplifier 111. The PMOS transistor M1 is connected so that a circuit is formed between a power supply voltage terminal and an output terminal AMPOUT (node N1), and an output terminal of the differential amplifying circuit 111 is connected to its gate. The differential amplifying circuit 111 differentially amplifies the voltage of the node N1 and a reference voltage VREF, and outputs a differential amplified signal. In this way, the voltage of the node N1 is controlled.

The discharging circuit 120 includes NMOS transistors M2-M5. The NMOS transistors M2 and M3 are connected in series between the node N1 and a ground terminal, and the NMOS transistors M4 and M5 are connected in series between the node N1 and the ground terminal.

The NMOS transistor M4 conducts when a bias VIREFN1 is applied to its gate. The NMOS transistor M5 conducts when an enable signal EN is applied. The enable signal EN is switched to "H" at the same time of the start of the operation of the step-up circuit 12a.

In addition, the NMOS transistor M2 conducts when a bias VIREFN2 is applied to its gate. The NMOS transistor M3 conducts when the enable signal ENB, which is output from the current replica circuit 200, is applied. The enable signal ENB, as will be described later, is turned to "H" when the replica current Ireplica is lowered to a prescribed value or greater. Therefore, a current path, which is formed by the NMOS transistors M2 and M3, is usually in a nonconductive state (cut-off state) and is set to a conductive state only when the replica current Ireplica is lowered to a prescribed value or more.

Moreover, the current replica circuit 200 includes a PMOS transistor M6 and a current level detector 210. The PMOS transistor M6 is connected to the PMOS transistor M1 and a current mirror. In other words, the source of the PMOS transistor M6 is connected to the power supply voltage terminal, and its drain is connected to the current level detector 210. Furthermore, its gate is connected to the gate of the PMOS transistor M1.

Figure 9:
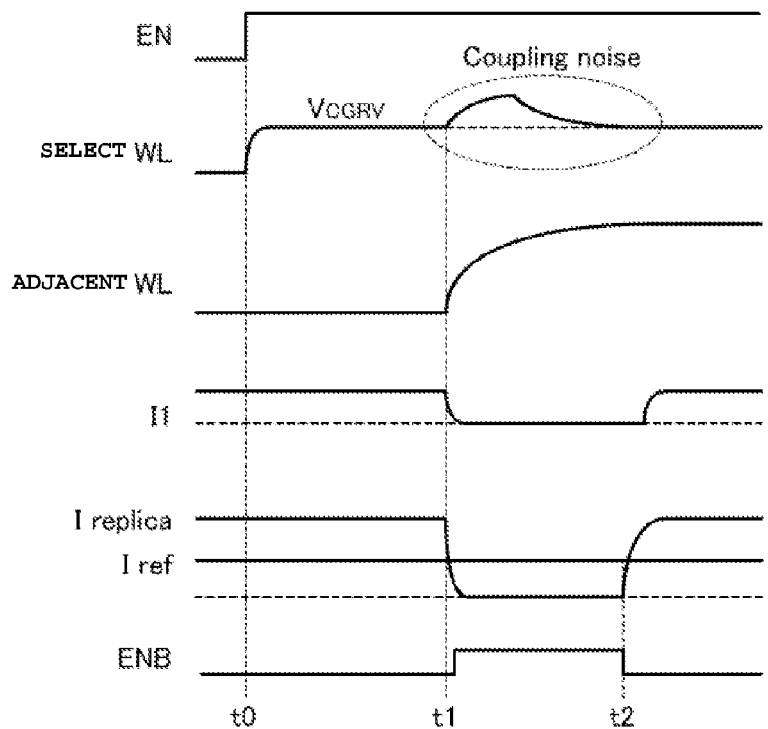
FIG. 9 is a timing chart depicting an example operation of the first embodiment.

Next, the operation of the step-up circuit 12a will be explained with reference to a timing charge of FIG. 9. At time t0, if the enable signal EN is switched to "H", the operation of the step-up circuit 12a is started. The output voltage of the output terminal AMPOUT is raised up to the voltage $V_{CGRV}$ that is determined by the reference voltage VREF. The current path including the NMOS transistors M4 and M5 sends a current I2, and the differential amplifier 111 controls a current I1. At that time, since the enable signal ENB is at "L", no current flows to the NMOS transistors M2 and M3. With the balance of the currents I1 and I2, the voltage of the output terminal AMPOUT is controlled to the voltage $V_{CGRV}$.

At time t1, if the voltage of non-selected word lines WL (adjacent WL) adjacent to selected word lines starts to be raised by the operation of the step-up circuit 12a', the voltage of the selected word lines WL (the voltage of the output terminal AMPOUT) is raised by capacitive coupling (coupling noise is generated).

If the voltage of the output voltage AMPOUT is raised, the current I1 is lowered by the action of the differential amplifier 111. Along with it, the value of the replica current Ireplica is also lowered. The replica current Ireplica is compared with the reference current Iref in the current level detector 210. Next, if the current level detection circuit 210 decides that the replica current Ireplica reaches the reference current Iref or lower, the current level detector 210 switches the enable signal ENB to "H." Therefore, the current path of the NMOS transistors M2 and M3 is set to a conductive state (the current of the current path is changed from zero to Itail2 (>0), pulling down the voltage of the node N1. Thereby, the voltage of the selected word lines WL (output terminal AMPOUT) raised by the capacitive coupling is rapidly converged to the original, intended voltage $V_{CGRV}$. If the voltage of the output terminal AMPOUT returns to the voltage $V_{CGRV}$, the current I1 also returns to the original value, so that the enable signal ENB also falls to "L". In this manner, the voltage of the selected word line WL can be rapidly returned to a desired value, even if it is raised by capacitive coupling.

Figure 10:
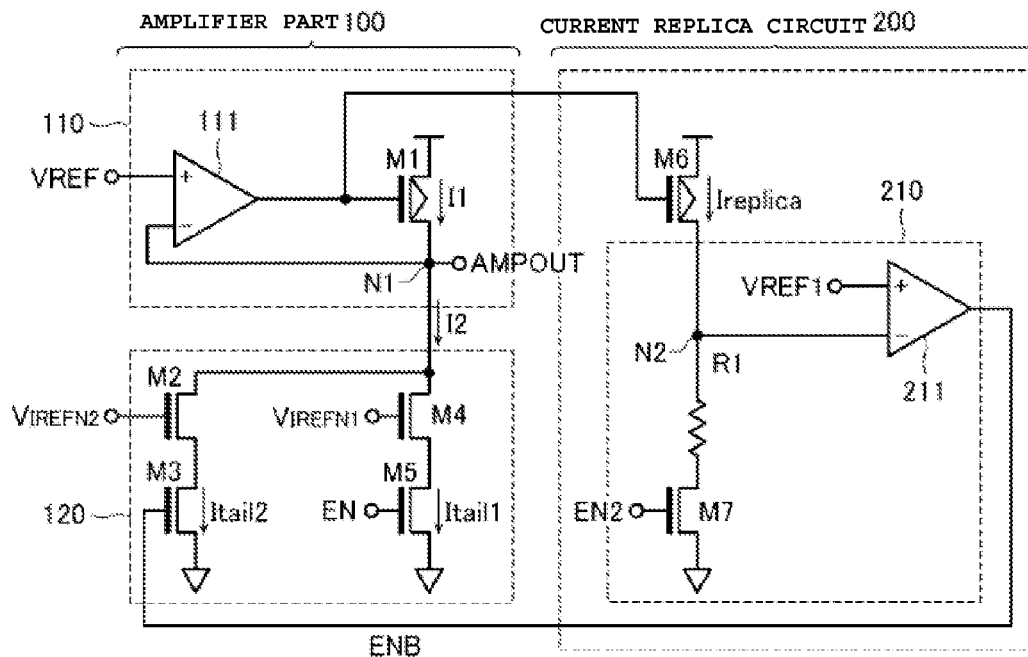
FIG. 10 is a circuit diagram depicting the step-up circuit according to the first embodiment.

FIG. 10 shows a detailed constitutional example of the current level detector 210 of the current replica current 200. The current level detector 210 includes differential amplifying circuit 211, resistor R1, and NMOS transistor M7.

The resistor R1 and the NMOS transistor M7 are connected in series between the drain (node N2) of the PMOS transistor and the ground terminal. The NMOS transistor M7 is operated when the enable signal EN2 is applied. The differential amplifier 211 differentially amplifies the voltage of the reference voltage VREF1 and the voltage of the node N2 and outputs the enable signal ENB.

(Effects of First Embodiment)

According to the first embodiment, the voltage in wirings raised by capacitive coupling can be rapidly returned to a desired voltage, thus being able to improve the performance of the device.

(Second Embodiment)

Figure 11:
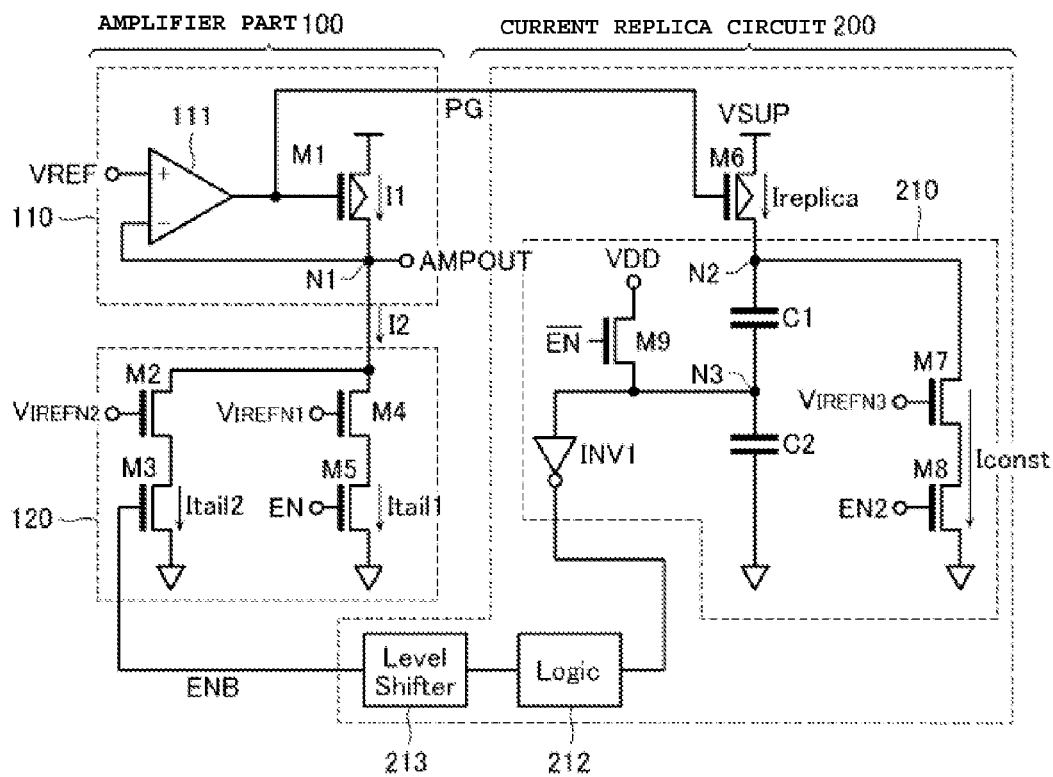
FIG. 11 is a circuit diagram depicting a step-up circuit according to a second embodiment.

Next, the semiconductor memory device of the second embodiment will be explained with reference to FIG. 11. Since the semiconductor memory device is similar to that of the first embodiment, detailed explanation of common aspects will be omitted in the following. However, the second embodiment differs from first embodiment in the configuration of the current replica circuit 200 of the step-up circuit 12a.

The constitution of the current replica circuit 200 of the second embodiment will be explained with reference to FIG. 11. In the current level detector 210 of the current replica circuit 200, NMOS transistors M7 and M8 are connected in series between the node N2 and the ground terminal. A bias VIREFN3 is applied to the gate of the NMOS transistor M7, and the enable EN2 is applied to the gate of the NMOS transistor M8. Therefore, the NMOS transistors M7 and M8 function as constant current circuits for sending a constant current Iconst to their current path.

In addition, capacitors C1 and C2 are connected in series between the node N2 and the ground terminal. An input terminal of an inverter INV1 is connected to a connecting node N3 between the capacitors C1 and C2. An output signal of the inverter INV1 is input into a logic circuit 212, and an output signal of the logic circuit 212 is output as the enable signal ENB to the gate of the NMOS transistor M3 via a level shifter 213. Here, the NMOS transistor M9 conducts by an inverted signal/EN of the enable signal EN and precharges the potential of the node n3.

The current I1 in this embodiment is lowered by the same principle as that of the first embodiment, and the replica current Ireplica is lowered along with it, so that electric charges of the capacitors C1 and C2 flow out via the NMOS transistors M7 and M8, thereby lowering the potential of the node N3. If the potential of the node N3 reaches a prescribed value or smaller, the enable signal ENB rises to "H". In other words, the same effects as those of the first embodiment can be achieved.

Figure 12:
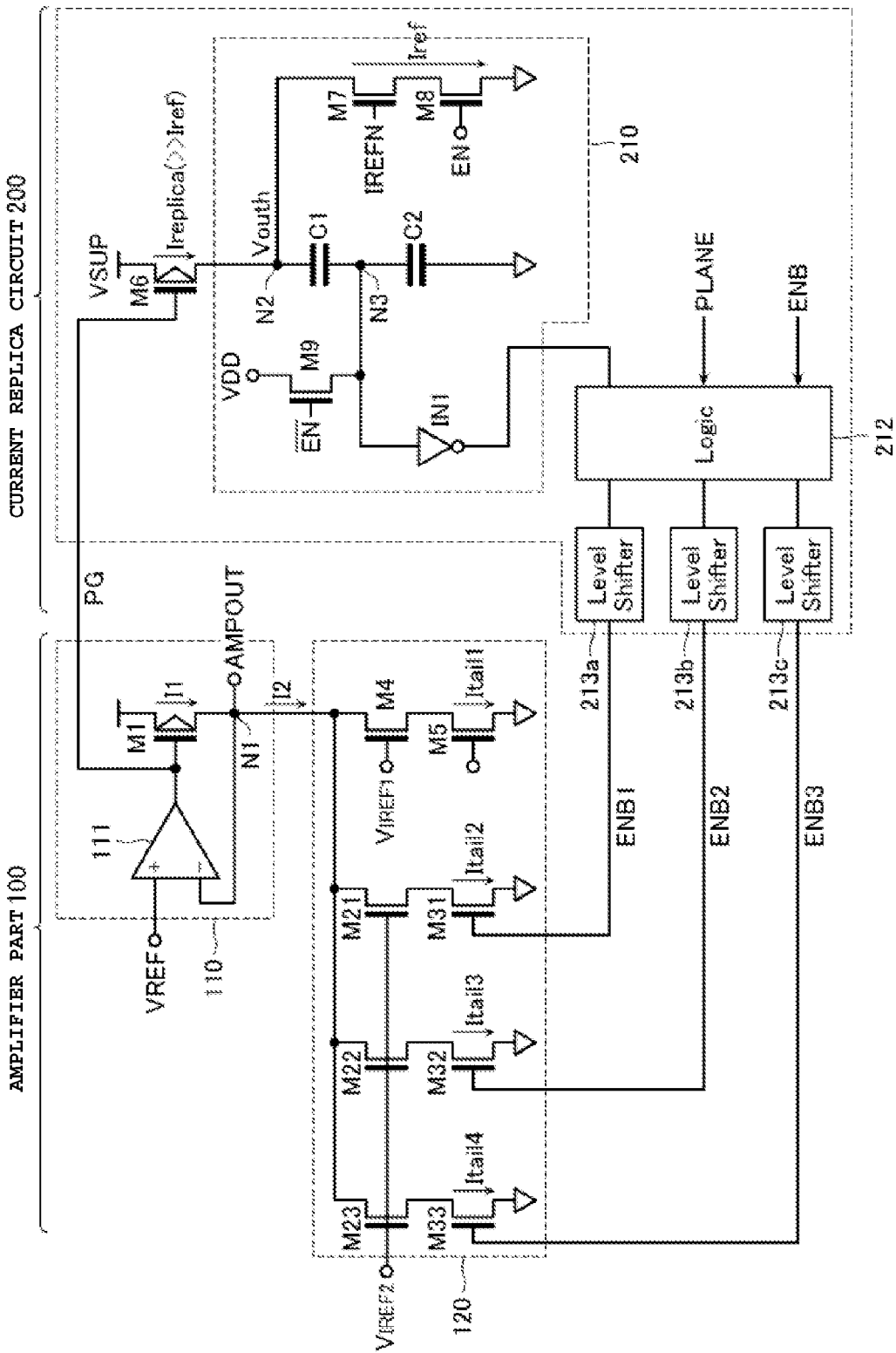
FIG. 12 is a circuit diagram depicting the step-up circuit according to the second embodiment.

FIG. 12 shows the step-up circuit 12a of a modified example of the second embodiment. In FIG. 12, the same symbols will also be given to the same constituent elements as those of FIG. 11, and the explanation for common features will be omitted in the following. In this modified example, the discharging circuit 120 is provided with four current paths including NMOS transistors M4, M5, M21, M22, M23, M31, M32, and M33. The NMOS transistors M21 and M31 are connected in series between the node N1 and the ground terminal, the NMOS transistors M22 and M32 are connected in series between the node N1 and the ground terminal, and the NMOS transistors M23 and M33 are connected in series between the node N1 and the ground terminal. The NMOS transistors M31-M33 are respectively conducted when the enable signals ENB1-ENB3, which are transmitted from level shifters 213a-213c, are rendered.

The logic circuit 212 has a function of determining all of the enable signals ENB1-3 to "H", or selectively determining only part of the enable signals to "H", when a signal PLANE for specifying a plane, in which the memory cell array AR1 is formed, and an enable signal ENB0 are transmitted and the current Ireplica is lower than the reference current Iref based on the signal PLANE. According to the configuration of FIG. 12, the discharge performance of the discharging circuit 120 can be changed for each plane. Therefore, variations in the characteristics between the planes can be absorbed.

OTHER EXAMPLES

For example, in the aforementioned embodiments, the three-dimensional NAND-type flash memory has been explained as an example; however, the embodiments can also be applied to other memories, for example, a planar NAND-type flash memory. In addition, in the aforementioned embodiments, an example in which the current path of the discharging circuit 120 is cut off or conducted by the enable signal ENB has been explained. However, without being limited to this, the embodiment may be applied to other cases as long as the amount of current flowing in the current path can be changed.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The structure of the memory cell array is not limited to as described above. A memory cell array formation may be as disclosed in U.S. patent application Ser. No. 12/532,030, the entire contents of which are incorporated by reference herein.

What is claimed is:

1. A semiconductor memory device, comprising:
    a memory cell array in which a plurality of memory cells are arranged;
    a first wiring connected to a memory cell;
    a discharging circuit configured to discharge a voltage of the first wiring according to a first current;
    a charging circuit configured to charge the voltage of the first wiring according to a second current;
    a control circuit configured to detect the voltage of the first wiring and control a magnitude of the second current based on the detected voltage; and
    a current detection unit configured to generate a third current that is proportional to the second current and a detection result,
    the discharging circuit is configured to control a magnitude of the first current in accordance with the detection result.

2. The semiconductor memory device according to claim 1, wherein
    the charging circuit comprises a first transistor; and
    the current detection unit comprises a second transistor having a current mirror connection with the first transistor.

3. The semiconductor memory device according to claim 2, wherein
    the discharging circuit has a plurality of current paths; and
    at least one current path of the plurality is configured to allow the magnitude of the first current to be changed in accordance with the detection result.

4. The semiconductor memory device according to claim 2, wherein the current detection unit comprises:
    a capacitor connected between a first end portion of the second transistor and a ground terminal; and
    a constant current circuit connected between the first end portion of the second transistor and the ground terminal.

5. The semiconductor memory device according to claim 1, wherein the discharging circuit comprises a plurality of current paths, and at least one current path of the plurality is configured to allow the magnitude of the first current to be changed in accordance with the detection result.

* * * * *